United States Patent
Dokai et al.

(10) Patent No.: US 8,228,075 B2
(45) Date of Patent: Jul. 24, 2012

(54) TEST SYSTEM FOR RADIO FREQUENCY IC DEVICES AND METHOD OF MANUFACTURING RADIO FREQUENCY IC DEVICES USING THE SAME

(75) Inventors: Yuya Dokai, Nagaokakyo (JP); Noboru Kato, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 545 days.

(21) Appl. No.: 12/388,826

(22) Filed: Feb. 19, 2009

(65) Prior Publication Data

US 2009/0153332 A1 Jun. 18, 2009

Related U.S. Application Data

(63) Continuation of application No. PCT/JP2007/066007, filed on Aug. 17, 2007.

(30) Foreign Application Priority Data

Aug. 24, 2006 (JP) ................................. 2006-227591

(51) Int. Cl.
G01R 31/02 (2006.01)
(52) U.S. Cl. ...................... 324/652; 324/654; 324/655
(58) Field of Classification Search ............. 324/754.01, 324/754.03, 652, 72.5
See application file for complete search history.

(56) References Cited

U.S. PATENT DOCUMENTS

| | | | |
|---|---|---|---|
| 3,364,564 A | 1/1968 | Kurtz et al. | |
| 4,794,397 A | 12/1988 | Ohe et al. | |
| 5,232,765 A | 8/1993 | Yano et al. | |
| 5,253,969 A | 10/1993 | Richert | |
| 5,337,063 A | 8/1994 | Takahira | |
| 5,374,937 A | 12/1994 | Tsunekawa et al. | |
| 5,399,060 A | 3/1995 | Richert | |
| 5,491,483 A | 2/1996 | D'Hont | |
| 5,757,074 A | 5/1998 | Malloubian et al. | |
| 5,903,239 A | 5/1999 | Takahashi et al. | |
| 5,936,150 A | 8/1999 | Kobrin et al. | |
| 5,955,723 A | 9/1999 | Reiner | |
| 5,995,006 A | 11/1999 | Walsh | |
| 6,104,611 A | 8/2000 | Lastinger | |
| 6,107,920 A | 8/2000 | Eberhardt et al. | |
| 6,172,608 B1 | 1/2001 | Cole | |

(Continued)

FOREIGN PATENT DOCUMENTS

EP 0 977 145 A2 2/2000

(Continued)

OTHER PUBLICATIONS

Official Communication issued in International Application No. PCT/JP2007/066007, mailed on Nov. 27, 2007.

(Continued)

*Primary Examiner* — Vincent Q Nguyen
(74) *Attorney, Agent, or Firm* — Keating & Bennett, LLP

(57) ABSTRACT

A test system for a radio frequency IC device includes a radio frequency IC chip and a radiation strip. The characteristics of the radio frequency IC device are measured by bringing the tip of a probe of a test apparatus in direct contact with a portion of the radiation strip and thereby providing a radio frequency signal. The tip of the probe is made to be a flat plate so as to obtain closer and more stable contact with the radiation strip.

6 Claims, 5 Drawing Sheets

U.S. PATENT DOCUMENTS

| | | |
|---|---|---|
| 6,181,287 B1 | 1/2001 | Beigel |
| 6,190,942 B1 | 2/2001 | Wilm et al. |
| 6,236,223 B1* | 5/2001 | Brady et al. ............... 324/750.3 |
| 6,259,369 B1 | 7/2001 | Monico |
| 6,271,803 B1 | 8/2001 | Watanabe et al. |
| 6,335,686 B1 | 1/2002 | Goff et al. |
| 6,362,784 B1 | 3/2002 | Kane et al. |
| 6,367,143 B1 | 4/2002 | Sugimura |
| 6,378,774 B1 | 4/2002 | Emori et al. |
| 6,406,990 B1 | 6/2002 | Kawai |
| 6,448,874 B1 | 9/2002 | Shiino et al. |
| 6,462,716 B1 | 10/2002 | Kushihi |
| 6,542,050 B1 | 4/2003 | Arai et al. |
| 6,600,459 B2 | 7/2003 | Yokoshima et al. |
| 6,634,564 B2 | 10/2003 | Kuramochi |
| 6,664,645 B2 | 12/2003 | Kawai |
| 6,763,254 B2 | 7/2004 | Nishikawa |
| 6,828,881 B2 | 12/2004 | Mizutani et al. |
| 6,927,738 B2 | 8/2005 | Senba et al. |
| 6,963,729 B2 | 11/2005 | Uozumi |
| 7,088,307 B2 | 8/2006 | Imaizumi |
| 7,112,952 B2 | 9/2006 | Arai et al. |
| 7,119,693 B1 | 10/2006 | Devilbiss |
| 7,129,834 B2 | 10/2006 | Naruse et al. |
| 7,248,221 B2 | 7/2007 | Kai et al. |
| 7,250,910 B2 | 7/2007 | Yoshikawa et al. |
| 7,276,929 B2 | 10/2007 | Arai et al. |
| 7,317,396 B2 | 1/2008 | Ujino |
| 7,405,664 B2 | 7/2008 | Sakama et al. |
| 2002/0011967 A1 | 1/2002 | Goff et al. |
| 2002/0044092 A1 | 4/2002 | Kushihi |
| 2002/0052155 A1* | 5/2002 | Campbell et al. ............. 439/824 |
| 2002/0067316 A1 | 6/2002 | Yokoshima et al. |
| 2004/0001027 A1 | 1/2004 | Killen et al. |
| 2004/0217915 A1 | 11/2004 | Imaizumi |
| 2004/0219956 A1 | 11/2004 | Iwai et al. |
| 2004/0227673 A1 | 11/2004 | Iwai et al. |
| 2005/0092836 A1 | 5/2005 | Kudo |
| 2005/0099337 A1 | 5/2005 | Takei et al. |
| 2005/0125093 A1 | 6/2005 | Kikuchi et al. |
| 2005/0140512 A1 | 6/2005 | Sakama et al. |
| 2005/0232412 A1 | 10/2005 | Ichihara et al. |
| 2005/0236623 A1 | 10/2005 | Takechi et al. |
| 2005/0275539 A1 | 12/2005 | Sakama et al. |
| 2006/0001138 A1 | 1/2006 | Sakama et al. |
| 2006/0055601 A1 | 3/2006 | Kameda et al. |
| 2006/0071084 A1 | 4/2006 | Detig et al. |
| 2006/0109185 A1 | 5/2006 | Iwai et al. |
| 2006/0158380 A1 | 7/2006 | Son et al. |
| 2006/0267138 A1 | 11/2006 | Kobayashi |
| 2007/0004028 A1 | 1/2007 | Lair et al. |
| 2007/0018893 A1 | 1/2007 | Kai et al. |
| 2007/0040028 A1 | 2/2007 | Kawamata |
| 2007/0052613 A1 | 3/2007 | Gallschuetz et al. |
| 2007/0139057 A1 | 6/2007 | Nguyen et al. |
| 2007/0152687 A1* | 7/2007 | Tsao ............................. 324/754 |
| 2007/0252700 A1 | 11/2007 | Ishihara et al. |
| 2007/0285335 A1 | 12/2007 | Bungo et al. |
| 2008/0024156 A1 | 1/2008 | Arai et al. |
| 2008/0169905 A1 | 7/2008 | Slatter |
| 2008/0272885 A1 | 11/2008 | Atherton |
| 2009/0002130 A1 | 1/2009 | Kato |

FOREIGN PATENT DOCUMENTS

| | | |
|---|---|---|
| JP | 50-143451 A | 11/1975 |
| JP | 62-127140 U | 8/1987 |
| JP | 05-327331 A | 12/1993 |
| JP | 06-077729 A | 3/1994 |
| JP | 06-177635 A | 6/1994 |
| JP | 07-183836 A | 7/1995 |
| JP | 08-056113 A | 2/1996 |
| JP | 8-87580 A | 4/1996 |
| JP | 11-149537 A | 6/1996 |
| JP | 08-279027 A | 10/1996 |
| JP | 08-307126 A | 11/1996 |
| JP | 08-330372 A | 12/1996 |
| JP | 09-014150 A | 1/1997 |
| JP | 09-245381 A | 9/1997 |
| JP | 09-252217 A | 9/1997 |
| JP | 09-270623 A | 10/1997 |
| JP | 9-512367 A | 12/1997 |
| JP | 10-505466 A | 5/1998 |
| JP | 10-171954 A | 6/1998 |
| JP | 10-293828 A | 11/1998 |
| JP | 11-085937 A | 3/1999 |
| JP | 11-149538 A | 6/1999 |
| JP | 11-210420 A | 8/1999 |
| JP | 11-328352 A | 11/1999 |
| JP | 11-346114 A | 12/1999 |
| JP | 11-515094 A | 12/1999 |
| JP | 2000-21128 A | 1/2000 |
| JP | 2000-021639 A | 1/2000 |
| JP | 2000-022421 A | 1/2000 |
| JP | 2005-229474 A | 1/2000 |
| JP | 2000-059260 A | 2/2000 |
| JP | 2000-085283 A | 3/2000 |
| JP | 2000-090207 A | 3/2000 |
| JP | 2000-132643 A | 5/2000 |
| JP | 2000-137778 A | 5/2000 |
| JP | 2000-148948 A | 5/2000 |
| JP | 2000-172812 A | 6/2000 |
| JP | 2000510271 A | 8/2000 |
| JP | 2000-276569 A | 10/2000 |
| JP | 2000-286634 A | 10/2000 |
| JP | 2000-286760 A | 10/2000 |
| JP | 2000-311226 A | 11/2000 |
| JP | 2000-321984 A | 11/2000 |
| JP | 2001-028036 A | 1/2001 |
| JP | 2007-18067 A | 2/2001 |
| JP | 2001-66990 A | 3/2001 |
| JP | 2001-18628 A | 6/2001 |
| JP | 2001-256457 A | 9/2001 |
| JP | 2001-514777 A | 9/2001 |
| JP | 2001-319380 A | 11/2001 |
| JP | 2001-331976 A | 11/2001 |
| JP | 2001-332923 A | 11/2001 |
| JP | 2001-344574 A | 12/2001 |
| JP | 2001-351084 A | 12/2001 |
| JP | 2002-024776 A | 1/2002 |
| JP | 2002-042076 A | 2/2002 |
| JP | 2002-505645 A | 2/2002 |
| JP | 2002-76750 A | 3/2002 |
| JP | 2002-150245 A | 5/2002 |
| JP | 2002-175508 A | 6/2002 |
| JP | 2002-183690 A | 6/2002 |
| JP | 2002-185358 A | 6/2002 |
| JP | 2002-204117 A | 7/2002 |
| JP | 2002-522849 A | 7/2002 |
| JP | 2002-230128 A | 8/2002 |
| JP | 2002-298109 A | 10/2002 |
| JP | 2002-319008 A | 10/2002 |
| JP | 2002-362613 A | 12/2002 |
| JP | 2002-373029 A | 12/2002 |
| JP | 2002-373323 A | 12/2002 |
| JP | 2003-016412 A | 1/2003 |
| JP | 2003-030612 A | 1/2003 |
| JP | 2003-44789 A | 2/2003 |
| JP | 2003-58840 A | 2/2003 |
| JP | 2003-158414 A | 2/2003 |
| JP | 2003-067711 A | 3/2003 |
| JP | 2003-076947 A | 3/2003 |
| JP | 2003-085501 A | 3/2003 |
| JP | 2003-085520 A | 3/2003 |
| JP | 2003-87008 A | 3/2003 |
| JP | 2003-87044 A | 3/2003 |
| JP | 2003-099720 A | 4/2003 |
| JP | 2003-099721 A | 4/2003 |
| JP | 2003-110344 A | 4/2003 |
| JP | 2003-132330 A | 5/2003 |
| JP | 2003-134007 A | 5/2003 |
| JP | 2003-155062 A | 5/2003 |
| JP | 2003-187207 A | 7/2003 |
| JP | 2003-187211 A | 7/2003 |
| JP | 2003-198230 A | 7/2003 |
| JP | 2003-209421 A | 7/2003 |
| JP | 2003-218624 A | 7/2003 |

| | | | |
|---|---|---|---|
| JP | 2003-233780 A | 8/2003 | |
| JP | 2003-242471 A | 8/2003 | |
| JP | 2003-243918 A | 8/2003 | |
| JP | 2003-288560 A | 10/2003 | |
| JP | 2003-309418 A | 10/2003 | |
| JP | 2003-332820 A | 11/2003 | |
| JP | 2004-88218 A | 3/2004 | |
| JP | 2004-096566 A | 3/2004 | |
| JP | 2004-253858 A | 9/2004 | |
| JP | 2004-287767 A | 10/2004 | |
| JP | 2004-297249 A | 10/2004 | |
| JP | 2004-326380 A | 11/2004 | |
| JP | 2004-334268 A | 11/2004 | |
| JP | 2004-336250 A | 11/2004 | |
| JP | 2004-343000 A | 12/2004 | |
| JP | 2004-362190 A | 12/2004 | |
| JP | 2004-362341 A | 12/2004 | |
| JP | 2004-362602 A | 12/2004 | |
| JP | 2005-136528 A | 5/2005 | |
| JP | 2005-165839 A | 6/2005 | |
| JP | 2005-167327 A | 6/2005 | |
| JP | 2005-191705 A | 7/2005 | |
| JP | 2005-210676 A | 8/2005 | |
| JP | 2005-210680 A | 8/2005 | |
| JP | 2005-217822 A | 8/2005 | |
| JP | 2005-236339 A | 9/2005 | |
| JP | 2005-244778 A | 9/2005 | |
| JP | 2005-275870 A | 10/2005 | |
| JP | 2005-295135 A | 10/2005 | |
| JP | 2005-311205 A | 11/2005 | |
| JP | 2005-321305 A | 11/2005 | |
| JP | 2005-335755 A | 12/2005 | |
| JP | 2005-346820 A | 12/2005 | |
| JP | 2005-352858 A | 12/2005 | |
| JP | 2006-031766 A | 2/2006 | |
| JP | 2006-39902 A | 2/2006 | |
| JP | 2006-67479 A | 3/2006 | |
| JP | 2006-72706 A | 3/2006 | |
| JP | 2006-80367 A | 3/2006 | |
| JP | 2006-92630 A | 4/2006 | |
| JP | 2006-102953 A | 4/2006 | |
| JP | 2006-148518 A | 6/2006 | |
| JP | 2006-195795 A | 7/2006 | |
| JP | 2006-270212 A | 10/2006 | |
| JP | 2006-309401 A | 11/2006 | |
| JP | 2007-65822 A | 3/2007 | |
| JP | 2007-150868 A | 6/2007 | |
| JP | 6-53733 A | 9/2007 | |
| JP | 11-175678 A | 1/2009 | |
| NL | 9100176 A | 3/1992 | |
| NL | 9100347 A | 3/1992 | |
| WO | 00/10122 A2 | 2/2000 | |
| WO | 03/079305 A1 | 9/2003 | |
| WO | 2004/036772 A1 | 4/2004 | |
| WO | 2004/070879 A | 8/2004 | |
| WO | 2004/072892 A1 | 8/2004 | |
| WO | 2005/073937 A | 8/2005 | |
| WO | 2005/115849 A1 | 12/2005 | |
| WO | 2006/045682 A | 5/2006 | |

OTHER PUBLICATIONS

Dokai et al.: "Wireless IC Device and Component for Wireless IC Device," U.S. Appl. No. 12/359,690, filed Jan. 26, 2009.
English translation of NL9100176, published on Mar. 2, 1992.
English translation of NL91130347, published on Mar. 2, 1992.
Kato et al.: "Antenna," U.S. Appl. No. 11/928 502, filed Oct. 30, 2007.
Kato et al.: "Wireless IC Device," U.S. Appl. No. 12/211,117, filed Sep. 1, 2008.
Kato et al.: "Antenna," U.S. Appl. No. 11/688,290, filed Mar. 20, 2007.
Kato et al.: "Electromagnetic-Coupling-Module-Attached Article," U.S. Appl. No. 11/740,509, filed Apr. 26, 2007.
Kato et al: "Product Including Power Supply Circuit Board," U.S. Appl. No. 12/234:949, filed Sep. 22, 2008.
Kato et al.: "Data Coupler," U.S. Appl. No. 12/252,475, filed Oct. 16, 2008.
Kate et al; "Information Terminal Device." U.S. Appl. No. 12/267,666, filed Nov. 10, 2008.
Kate et al.: "Wireless IC Device and Wireless IC Device Composite Component," U S. Appl. No. 12/276;444, filed Nov. 24, 2008.
Dokai et at: "Optical Disc," U.S Appl. No. 12/326,916, filed Dec. 3, 2008.
Dokai et at. "System for Inspecting Electromagnetic Coupling Modules and Radio IC Devices and Method for Manufacturing Electromagnetic Coupling Modules and Radio IC Devices Using the System." U.S. Appl. No. 12/274,400, filed Nov. 20, 2008.
Kate: "Wireless IC Device," U.S. Appl. No. 11/964,185, filed Dec. 26, 2007.
Kato et al: "Radio Frequency IC Device," U.S. Appl. No. 12/336,629, filed Dec. 17, 2008.
Kato et al.: "Wireless IC Device and Component for Wireless IC Device," U.S Appl. No. 12/339,198, filed Dec. 19, 2008.
Ikemoto et al.. "Wireless IC Device," U S. Appl. No. 11/851,651, filed Sep. 7, 2007.
Kataya et al.: "Wireless IC Device and Electronic Device" U.S. Appl. No. 11/851,661, filed Sep. 7, 2007.
Dokal et al.: "Antenna and Radio IC Device," U.S. Appl. No. 12/350,307, filed Jan. 8, 2009.
Official communication issued in Japanese Application No. 2007-531524, mailed on Sep. 11, 2007.
Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4. mailed on Nov. 24, 2008.
Mukku-Sha, "Mustin IC Tagu Katsuyo-no Subete" "(All About Wireless IC Tags")", RFID, pp. 112-126.
Dokai et al.: "Wireless IC Device and Component for Wireless IC Device," U.S. Appl. No. 11/624,382, filed Jan. 18, 2007.
Dokai et al.: "Wireless IC Device, and Component for Wireless IC Device," U.S. Appl. No. 11/930,818, filed Oct. 31, 2007.
Kato et al.: "Wireless IC Device," U.S. Appl. No. 12/042,399, filed Mar. 5, 2008.
Official communication issued in related U.S. Appl. No. 12/042,399; mailed on Aug. 25, 2008.
Official Communication issued in corresponding German Patent Application No. 11 2007 001 912.3, mailed on May 14, 2010.

* cited by examiner

TEST SYSTEM FOR RADIO FREQUENCY IC DEVICES AND METHOD OF MANUFACTURING RADIO FREQUENCY IC DEVICES USING THE SAME

BACKGROUND OF THE INVENTION

1. Field of the Invention

The present invention relates to a test system for radio frequency IC devices, particularly radio frequency IC devices used for radio frequency identification (RFID) systems, and to a method of manufacturing radio frequency IC devices using the test system.

2. Description of the Related Art

Recently, there have been rapid advances in technology regarding contactless identification media (e.g., contactless ID cards) called radio frequency identification (RFID) media, which are used in various areas. Such an RFID medium has a specific range of communication with a reader/writer defined in accordance with its performance, and thus, there is a demand for improved communication measurement and yield.

A typical existing manufacturing process for radio frequency IC devices used for RFID systems includes forming antenna coils on a film base and mounting radio frequency IC chips thereon such that a predetermined number of the devices are formed on the film base having a predetermined size. Then, the characteristics of each of the radio frequency IC devices are measured to determine whether it is a good product or not before it becomes a stand alone product.

However, since the test described above is performed at a stage before the radio frequency IC device is formed as a stand alone device, responses to a communication signal from an RFID reader/writer are received such that a desired response from a test piece, i.e., a test object, is mixed with responses from neighboring radio frequency IC devices. In this case, in addition to a problem of receiving unreliable data, there arises a problem in which, when the test object is a bad test piece, data from radio frequency IC devices that are near the bad test piece being measured may be received and may cause the bad test piece to be determined to be a good product, even though the test piece is not a good product. This allows bad products to be shipped.

Japanese Unexamined Patent Application Publication NO. 2003-99721 and Japanese Unexamined Patent Application Publication NO. 2003-76947 disclose test systems in which, in order to avoid cross talk caused by radio frequency IC devices in the vicinity of a test object, a shield member having an opening is provided between a radio frequency IC device to be tested and the antenna of a measurement system, where the opening enables the antenna of the measurement system to face only the radio frequency IC device to be tested. With this structure, responses to a communication signal from an RFID reader/writer are received such that a response from the radio frequency IC device to be tested is prevented from being mixed with responses from the neighboring radio frequency IC devices.

A test object in such test systems includes at least an antenna and a radio frequency IC chip. Since the antenna portion of such a radio frequency IC device is very large, radio frequency IC devices on a conveyor belt of the test system must be spaced apart from one another by a distance about the size of one radio frequency IC device. This causes a problem in which testing of one radio frequency IC device requires an increased amount of movement of the conveyor belt and test time, which leads to increased test costs.

Furthermore, a radio frequency IC device that includes at least an antenna and a radio frequency IC chip requires a process of mounting a radio frequency IC chip on a film that has antenna electrodes formed thereon, and a process of electrically connecting the antenna electrodes and the radio frequency IC chip. These manufacturing processes occupy the majority of the manufacturing time, and therefore, significantly increase manufacturing costs.

SUMMARY OF THE INVENTION

To overcome the problems described above, preferred embodiments of the present invention provide a test system for radio frequency IC devices that can reliably measure the characteristics of individual radio frequency IC devices in a short period of time, and a method of manufacturing radio frequency IC devices using the test system.

A test system for a radio frequency IC device according to a preferred embodiment of the present invention includes a radio frequency IC chip and a radiation strip. In the test system, a characteristic of the radio frequency IC device is measured by bringing a probe of a test apparatus into direct contact with a portion of the radiation strip. Thus, even a low-power test signal can be provided to the radio frequency IC chip directly through the radiation strip from the probe, and the test signal can be input to the radio frequency IC device to be tested without errors. Further, since data to be sent from the radio frequency IC device being tested is sent to the test apparatus from the radiation strip directly through the probe, the neighboring radio frequency IC devices are prevented from interfering with the measurement. When many radio frequency IC devices are tested in sequence, measurements can be made without difficulties even when the interval between the radio frequency IC devices is decreased. This decreases the test time and, therefore, the manufacturing time.

In the test system for a radio frequency IC device according to a preferred embodiment of the present invention, the probe is preferably brought into contact with an open end of the radiation strip. The radiation strip can be tested to determine whether it is cut or not from the end at which a feed circuit substrate is mounted to the open end, and the radiation characteristics of the entire radiation strip can be tested. The radio frequency IC device may preferably include a radio frequency IC chip mounted thereon and a feed circuit substrate that includes a resonant circuit having an inductor element, and the feed circuit substrate may preferably be electromagnetically coupled to the radiation strip. Further, the tip of the probe is preferably a flat plate. This prevents potential damage to the directly contacted surface of the radiation strip and enables more stable and secure contact. When testing is performed through electromagnetic coupling, the test can be easily performed by configuring the tip of the probe to have a coil shape.

In a method of manufacturing radio frequency IC devices according to a preferred embodiment of the present invention, radio frequency IC devices are manufactured using the test system for radio frequency IC devices described above.

According to various preferred embodiments of the present invention, the characteristics of a radio frequency IC device including a radio frequency IC chip and a radiation strip can be efficiently tested without errors, and as a result, radio frequency IC devices can be efficiently manufactured in a short period of time.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

A test system for radio frequency IC devices and a method of manufacturing radio frequency IC devices using the test system according to preferred embodiments of the present invention will be described below with reference to the attached drawings. A radio frequency IC device and a test system in each figure are schematically illustrated and components in the figures are shown using different scales.

Radio Frequency IC Device

Figure 1:
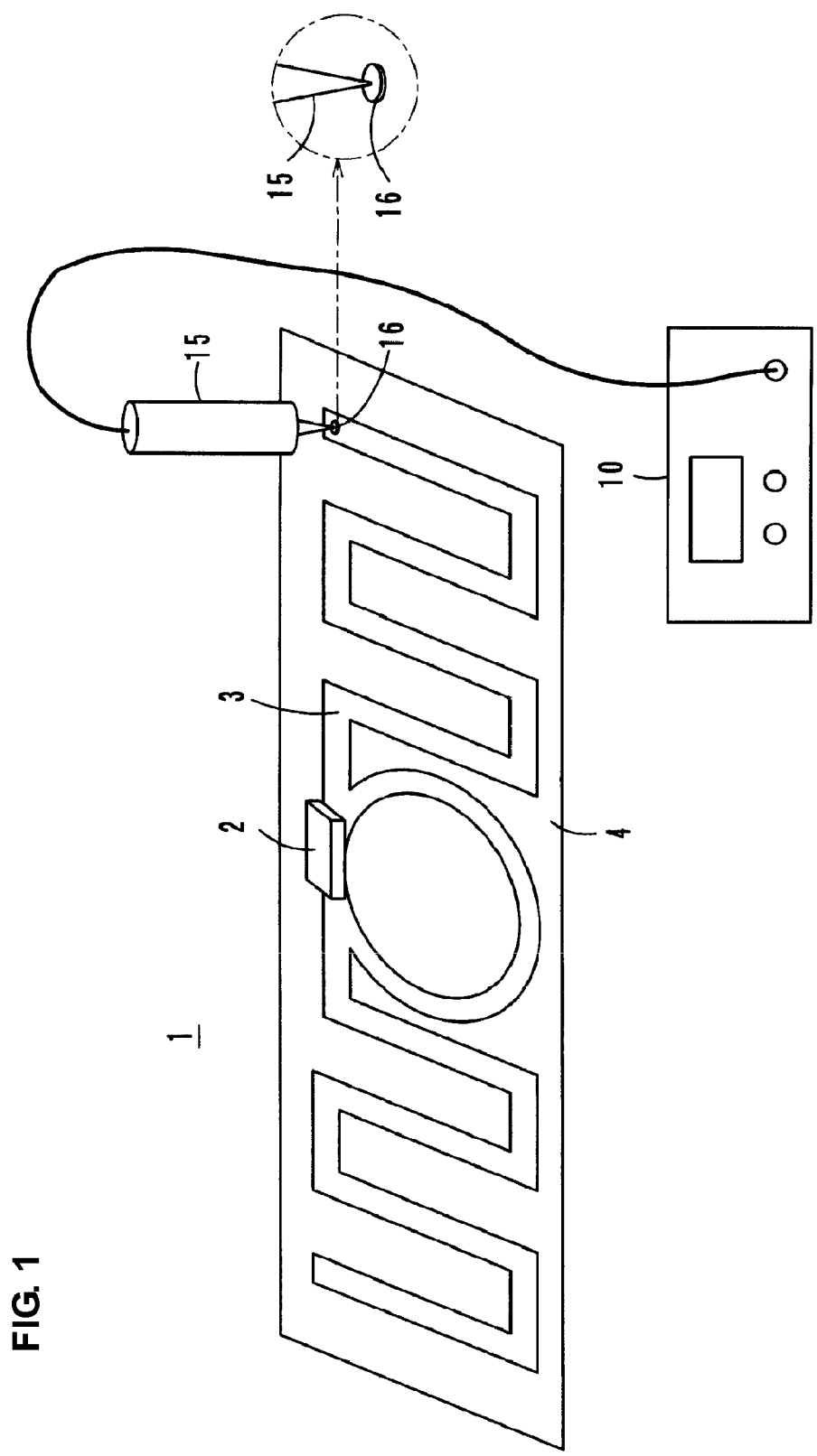
FIG. 1 is a perspective view showing a first example of a radio frequency IC device and a test system according to a first preferred embodiment of the present invention.
Figure 2:
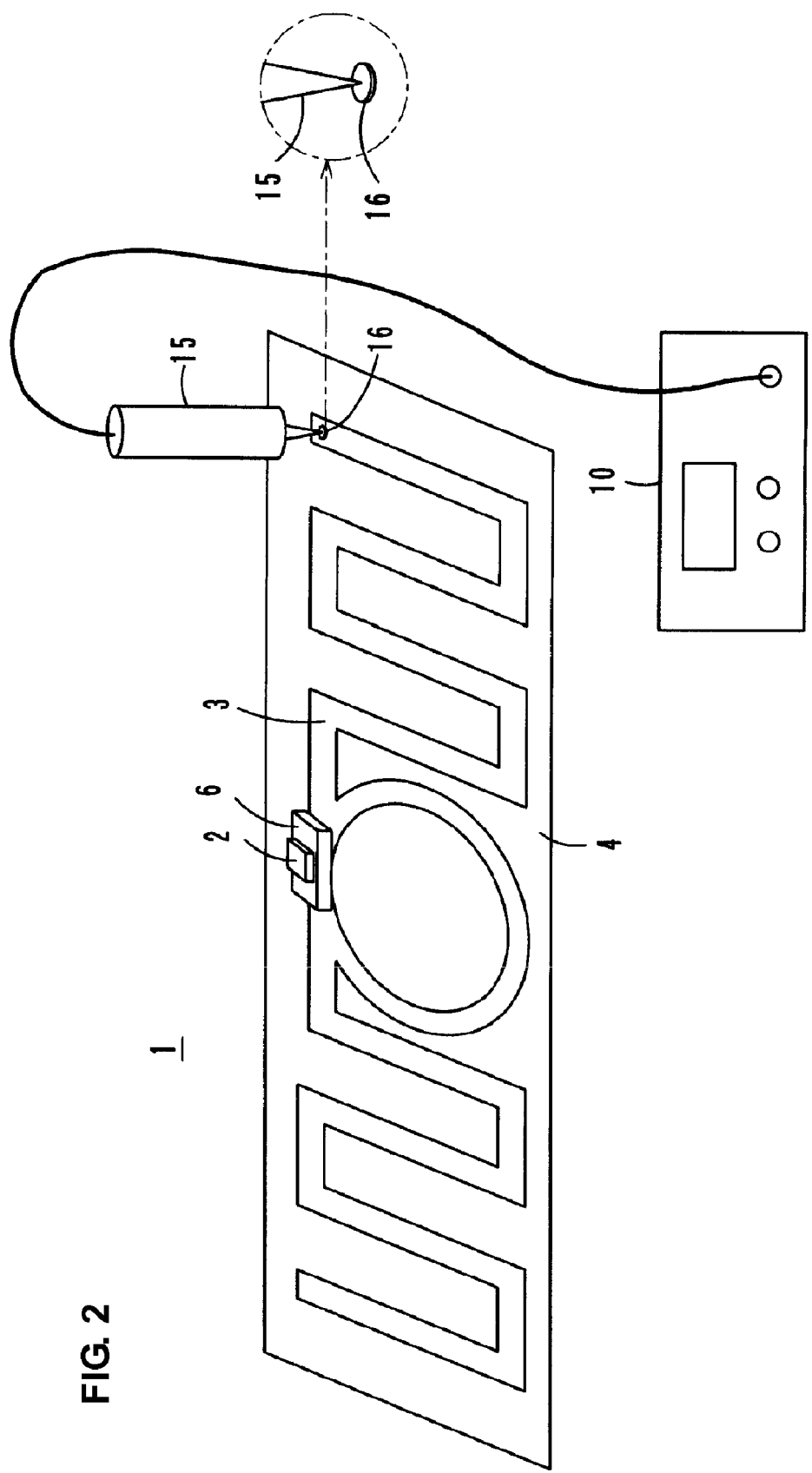
FIG. 2 is a perspective view showing a second example of a radio frequency IC device and a test system according to the first preferred embodiment of the present invention.
Figure 3:
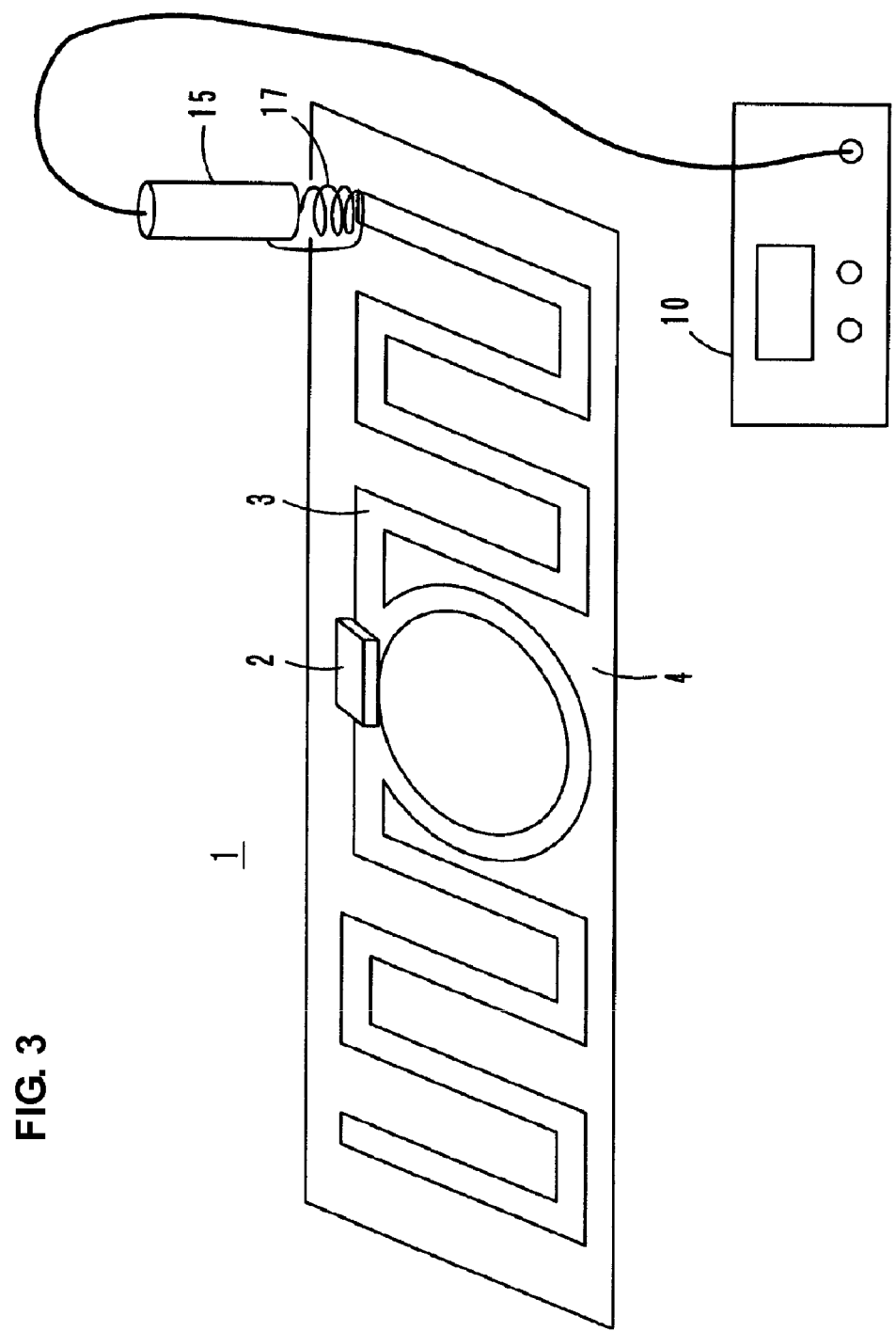
FIG. 3 is a perspective view showing the first example of a radio frequency IC device and a test system according to a second preferred embodiment of the present invention.

First, a radio frequency IC device to be tested by a test system according to preferred embodiments of the present invention is described. Referring to FIGS. 1 to 3, a radio frequency IC device 1 includes a radio frequency IC chip 2 and a radiation strip 3 made of a metal thin film (first example, with reference to FIGS. 1 and 3), or includes the radio frequency IC chip 2, a feed circuit substrate 6, and a radiation strip 3 (second example, with reference to FIG. 2). The radio frequency IC device 1 functions as a receiving/sending device that communicates with a reader/writer in an RFID system. For example, the radio frequency IC device 1 may preferably be used as a replacement for a conventional bar code used in a POS system or for physical distribution management or management of non-liquid assets.

The radio frequency IC chip 2 includes a clock circuit, a logic circuit, and a memory circuit which stores necessary information. The radio frequency IC chip 2 is connected to the radiation strip 3 directly or via the feed circuit substrate 6. The radiation strip 3 is preferably a strip made of a non-magnetic material, such as aluminum foil or copper foil, for example. That is, the radiation strip 3 is made of a metal thin film that is open-ended at both ends, and the radiation strip is preferably disposed on a flexible insulating resin film 4, such as PET, for example.

Figure 6:
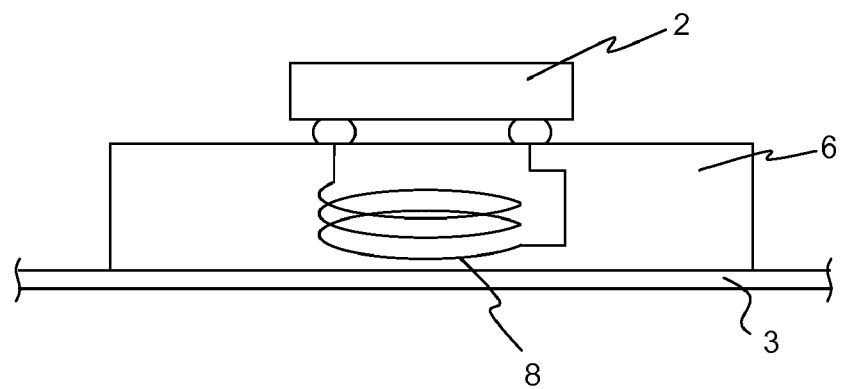
FIG. 6 is an enlarged view of a portion of the second example of the radio frequency IC device and the test system according to the first preferred embodiment of the present invention.

The radio frequency IC device 1 receives a radio frequency signal radiated from a reader/writer using the radiation strip 3, and provides the received signal to the radio frequency IC chip 2. The radio frequency IC chip 2 extracts a predetermined amount of energy from the received signal, uses this energy as a driving source, modulates an input signal so as to correspond to the information stored in the radio frequency IC chip 2 in order to produce a signal to be sent, and transmits this signal to the reader/writer through the radiation strip 3. The feed circuit substrate 6 includes a feed circuit that includes an inductor element 8, as shown in FIG. 6, arranged to perform impedance matching between the radio frequency IC chip 2 and the radiation strip 3.

Test System

FIG. 1 shows a test system for the radio frequency IC device 1 according to a first preferred embodiment of the present invention. The test system measures the characteristics of the radio frequency IC device 1 such that the tip of a probe 15 that is connected to a test apparatus 10 is in direct contact with a portion of the radiation strip 3, and the tip of the probe 15 is electromagnetically coupled to the radiation strip 3. The tip of the probe 15 is preferably configured to be a flat plate 16 so as to facilitate stable and secure contact with the radiation strip 3. Potential damage to the radiation strip 3 is also prevented by using the flat plate 16. During the test, the tip of the probe 15 is preferably in contact with an open end of the radiation strip 3. By bringing the tip of the probe 15 into contact with the open end of the radiation strip 3, the radiation strip 3 can be tested to determine whether it is good or not from the end at which the feed circuit substrate 6 is mounted to the open end. The radiation characteristics of the radio frequency IC device 1 including the entire radiation strip 3 can also be tested.

The memory of the test apparatus 10 preferably stores all of the test criteria of the radio frequency IC device 1 and the specifications (e.g., frequency used and commands) of the RFID system. The radio frequency IC device 1 is tested in accordance with the test criteria.

Specifically, the kind of RFID system used for the radio frequency IC device 1, a measurement frequency, and commands (specific to a system, showing the meaning of digital data) used for data sending/receiving are set. In addition, the test criteria of the radio frequency IC device 1 are set. After the probe 15 connected to the test apparatus 10 is brought into contact with the radiation strip 3, a transmitter (not shown) of the test apparatus 10 sends a signal (frequency modulated signal, for example) that includes information to be sent to the radio frequency IC chip 2 to the probe 15.

The radio frequency IC chip 2 demodulates the signal received by the radiation strip 3 from the probe 15, performs data processing, and converts data to be sent to the test apparatus 10 into a data signal to be sent. The data signal is sent to the probe 15 via electromagnetic coupling through the radiation strip 3. The data signal that is received by the probe 15 is sent to the test apparatus 10.

The test apparatus 10 demodulates the received data signal, performs data processing, and then determines whether the radio frequency IC device 1 passes all of the test criteria. If the radio frequency IC device 1 passes all of the test criteria, the tested radio frequency IC device 1 is determined to be a good product, and if not, the radio frequency IC device 1 is determined to be a bad product.

During the test described above, the tip of the probe 15 is in direct contact with the radiation strip 3. Thus, even a low-power test signal can be provided to the radio frequency IC chip 2 through the radiation strip 3 from the probe 15, and the test signal can be input to the radio frequency IC device 1 to be tested without errors, even though many other radio frequency IC devices are arranged in close proximity in the surrounding area (see, for example, FIGS. 4 and 5).

Likewise, a data signal to be sent from the radio frequency IC device 1 to be tested is sent to the test apparatus 10 from the radiation strip 3 directly through the probe 15. Thus, the neighboring radio frequency IC devices are prevented from interfering with the measurement. When many radio frequency IC devices 1 are tested in sequence, measurements can be made without difficulties even when the interval between the radio frequency IC devices 1 is decreased. This decreases the test time and, therefore, the manufacturing time.

Radio frequency IC devices 1 having various impedances can be tested by changing the shape of the probe 15, such that the impedance at the tip of the probe 15 approximately matches the impedances of the radio frequency IC devices 1 including the radiation strips 3.

FIG. 2 shows a test system for the radio frequency IC device 1 including the feed circuit substrate 6. The test system preferably is the same or substantially the same as the test system shown in FIG. 1. The feed circuit substrate 6 is arranged such that it is electromagnetically coupled to and insulated from the radiation strip 3. Thus, the radio frequency IC chip 2 is protected because an overcurrent is not applied to the radio frequency IC chip 2 when the probe 15 is brought into contact with the radiation strip 3.

FIG. 3 shows a test system for the radio frequency IC device 1 according to a second preferred embodiment of the present invention. This test system includes the probe 15 connected to the test apparatus 10 as in the first preferred embodiment described above. However, the probe 15 is different from the probe 15 of the first preferred embodiment in that the tip of the probe 15 includes a magnetic-field generating portion. Specifically, the tip portion preferably has a coiled portion 17 that is shaped like a loop coil, for example, and a portion of the coiled portion 17 is preferably in direct contact with the pattern of the radiation strip 3.

The second preferred embodiment operates and functions in the same or substantially the same manner as the first preferred embodiment, and the probe 15 and the radiation strip 3 are magnetically coupled because the portion that is in direct contact with the radiation strip 3 is the coiled portion 17. The probe 15 has even more stable and secure contact with the radiation strip 3.

Figure 4:
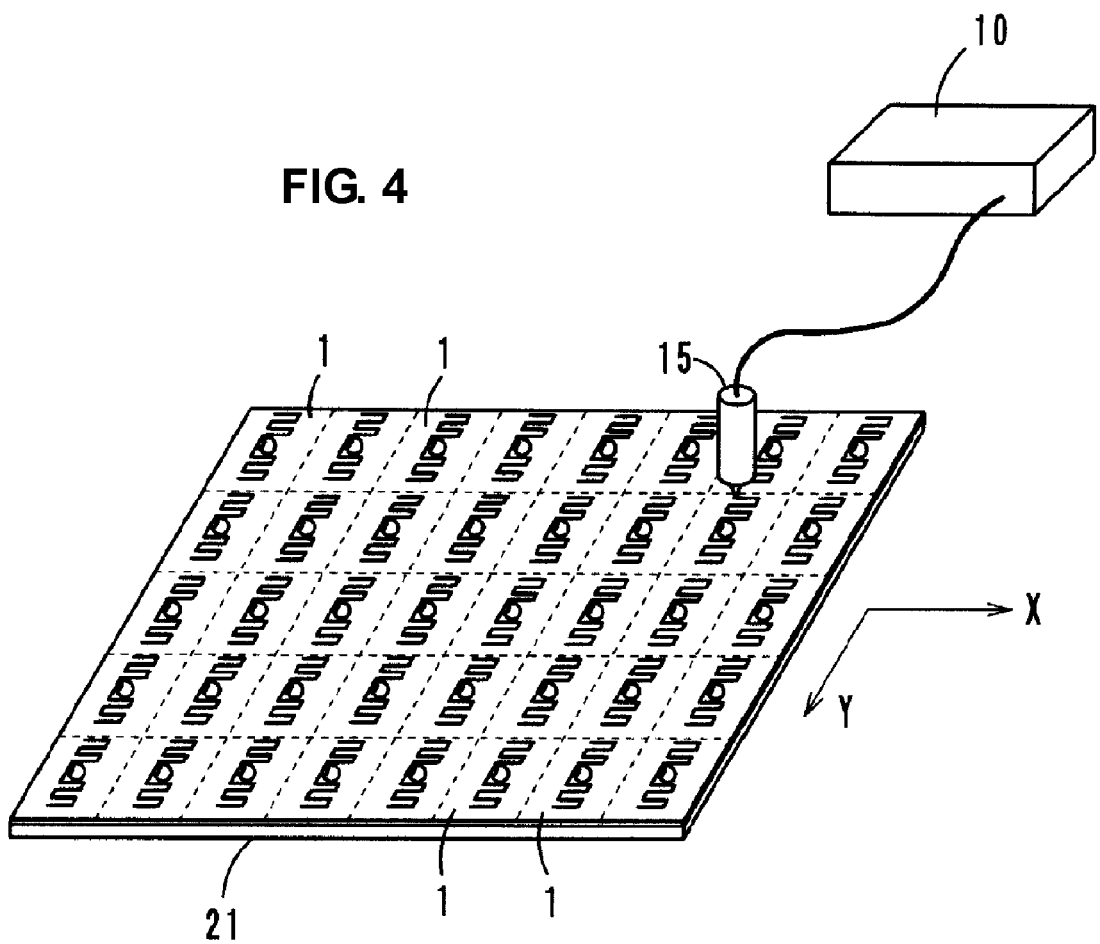
FIG. 4 is a perspective view showing a test process according to a preferred embodiment of the present invention.

Preferred Embodiment of Test Process in Manufacturing Process of Radio Frequency IC Devices Next, referring to FIG. 4, a preferred embodiment of a test process in the process of manufacturing the radio frequency IC device 1 is described. In this test process, many radio frequency IC devices 1 are arranged in a matrix on a rigid support plate 21, and the many radio frequency IC devices 1 are sequentially tested by moving either the support plate 21 or the probe 15 in the X and Y directions.

Figure 5:
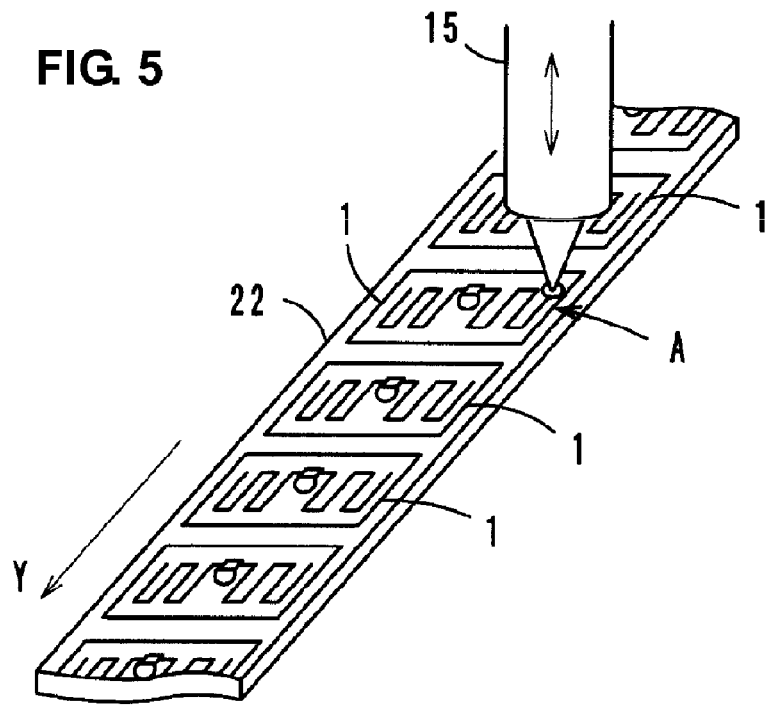
FIG. 5 is a perspective view showing a test process according to another preferred embodiment of the present invention.

Another Preferred Embodiment of Test Process in Manufacturing Process of Radio Frequency IC Devices Next, referring to FIG. 5, another preferred embodiment of a test process in the process of manufacturing the radio frequency IC device 1 is described. In this test process, many radio frequency IC devices 1 are arrayed on a rigid support plate 22 and are intermittently transported in the direction of arrow Y. The probe 15 sequentially tests the radio frequency IC devices 1 that are disposed at a predetermined position A.

A test system for radio frequency IC devices and a method of manufacturing radio frequency IC devices of the present invention are not limited to the preferred embodiments described above, and various modifications can be made within the scope of the present invention.

For instance, any suitable shape may be selected for the probe 15, any suitable shape may be selected for the radiation strip of the radio frequency IC device, and any suitable structure may be selected to connect the radiation strip to the radio frequency IC chip, for example.

As described above, preferred embodiments of the present invention are useful for a test system of radio frequency IC devices, and in particular, have an advantage that the characteristics of individual radio frequency IC devices can be reliably measured in a short period of time.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method of manufacturing a radio frequency IC device that includes a radio frequency IC chip and a radiation strip comprising the steps of:
    providing a test apparatus including a probe; and
    measuring a characteristic of the radio frequency IC device by bringing the probe of the test apparatus into direct contact with a portion of the radiation strip; wherein
    the radio frequency IC chip is directly or indirectly provided on the radiation strip during the measuring step.

2. The method of manufacturing a radio frequency IC device according to claim 1, wherein the probe is brought into contact with an open end of the radiation strip.

3. The method of manufacturing a radio frequency IC device according to claim 1, wherein the radio frequency IC device includes the radio frequency IC chip mounted thereon and a feed circuit substrate including a resonant circuit having an inductor element, and the feed circuit substrate is electromagnetically coupled with the radiation strip.

4. The method of manufacturing a radio frequency IC device according to claim 1, wherein a tip of the probe is a flat plate, and the tip of the probe is brought into contact with the radiation strip.

5. The method of manufacturing a radio frequency IC device according to claim 1, wherein a tip portion of the probe has elasticity, and the tip of the probe is brought into contact with the radiation strip.

6. The method of manufacturing a radio frequency IC device according to claim 5, wherein the tip portion of the probe is coil-shaped.

* * * * *